United States Patent [19]
Sanders et al.

[11] Patent Number: 5,955,221
[45] Date of Patent: Sep. 21, 1999

[54] METHOD AND APPARATUS FOR FABRICATION OF HIGH GRADIENT INSULATORS WITH PARALLEL SURFACE CONDUCTORS SPACED LESS THAN ONE MILLIMETER APART

[75] Inventors: David M. Sanders; Derek E. Decker, both of Livermore, Calif.

[73] Assignee: The Regents of the University of California, Oakland, Calif.

[21] Appl. No.: 08/976,244

[22] Filed: Nov. 21, 1997

[51] Int. Cl.$^6$ ................................................... G03H 1/02
[52] U.S. Cl. ............................ 430/2; 470/311; 470/317; 470/330; 470/331; 359/15; 361/321.3
[58] Field of Search ..................................... 361/313, 320, 361/301.4, 321.3, 321.6; 359/14, 567, 570; 430/320, 319, 311, 317, 314, 330, 331.2

[56] References Cited

U.S. PATENT DOCUMENTS

| | | | |
|---|---|---|---|
| 3,582,176 | 6/1971 | Mathisen | 430/1 |
| 3,614,193 | 10/1971 | Beiser | 359/570 |
| 4,049,413 | 9/1977 | French | 65/392 |
| 4,526,785 | 7/1985 | Trotter, Jr. | 428/209 |
| 4,807,950 | 2/1989 | Glenn et al. | 385/123 |
| 4,948,217 | 8/1990 | Keck et al. | 385/24 |
| 5,056,889 | 10/1991 | Morgan | 359/570 |
| 5,374,291 | 12/1994 | Yabe et al. | 65/30.11 |

FOREIGN PATENT DOCUMENTS

| | | | |
|---|---|---|---|
| 55-131730 | 10/1980 | Japan | 359/570 |
| 1-86110 | 3/1989 | Japan | 359/14 |
| 2221353 | 1/1990 | United Kingdom | 430/1 |

Primary Examiner—Martin Angebranndt
Attorney, Agent, or Firm—John P. Wooldridge

[57] ABSTRACT

Optical patterns and lithographic techniques are used as part of a process to embed parallel and evenly spaced conductors in the non-planar surfaces of an insulator to produce high gradient insulators. The approach extends the size that high gradient insulating structures can be fabricated as well as improves the performance of those insulators by reducing the scale of the alternating parallel lines of insulator and conductor along the surface. This fabrication approach also substantially decreases the cost required to produce high gradient insulators.

5 Claims, 4 Drawing Sheets

METHOD AND APPARATUS FOR FABRICATION OF HIGH GRADIENT INSULATORS WITH PARALLEL SURFACE CONDUCTORS SPACED LESS THAN ONE MILLIMETER APART

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to lithography, and more specifically, it relates to techniques for transferring parallel and evenly spaced patterns of light into conductive rings in or on the walls of a cylinder for use as a high gradient insulator.

2. Description of Related Art

Provisional Patent Application Ser. No. 60/039,979, filed Mar. 4, 1997 and titled "High Gradient Insulator," incorporated herein by reference, describes an approach for inhibiting the flashover breakdown of insulator structures by using alternating planes of insulator and conductor. One means of producing high gradient insulator designs includes stacking thin insulating cylinders and fusing them into one large cylinder with conductive material at the interface in between. That stack is subsequently machined to the desired geometry. This is a difficult and expensive process.

A high gradient insulator can also be achieved by simply embedding conducting rings into the surface of the insulator. One method involves selective removal of Chrome (coated on the insulator) using a laser (or other tool) while being rotated on a lathe to create a mask which is used for etching. This is also difficult and expensive to do properly.

The easier method of generating surface embedded conductors (narrowly spaced metal rings concentric with the cylinder) involves using lithographic techniques. Lithography is defined here as a method whereby light converts photoresist (or simply resist) into a mask by proper exposure of the resist and subsequent processing (including development). Developing resist entails use of a liquid developer to dissolve regions of resist where light either existed or did not exist during exposure. The effect of developer on exposed or unexposed resist depends on prior processing and whether positive or negative resist is used.

Three major problems are addressed by the lithographic technique. The need for fusing thin insulators together is eliminated. The need for using a lathe, where it is time consuming and difficult to align the cylinder axis to perfectly coincide with the axis of the lathe, is eliminated. An optical pattern is easily generated to properly expose the resist all at once. Eliminating moving parts simplifies the task enormously. Finally, the lithographic technique is able to reduce the spacing between conductors (say down to 300 nm). Interference lithography is the only fabrication method that can work on this scale. Just how fine the spacing can be and still get an increased benefit is still under investigation.

SUMMARY OF THE INVENTION

It is an object of the present invention to provide a method for transferring parallel and evenly spaced patterns of light into photoresist on the walls of a cylinder for use as a high gradient insulator.

This high gradient insulator fabrication process involves three basic steps. The first step makes use of optical and chemical techniques to convert parallel and evenly spaced patterns of light to a photoresist (or simply resist) mask by exposing and processing the resist. The second step transfers the pattern into the surface of insulators via masking (with resist or a metal like Chrome) and etching techniques. The third step involves metal deposition for filling etched grooves to embed conductors in the surface of the insulator, followed by mask removal, and possibly followed by polishing if necessary. It is the first step that this invention will address.

Within the first step described above there are two basic parts, generating the proper light pattern on the photoresist and then applying the proper post-exposure processing. The optical techniques for generating the proper light pattern on the photoresist can be selected from a group consisting of (1) back illuminated proximity mask; (2) interferometric fringe pattern generation; (3) holographic projection; and (4) Fabry-Perot pattern generation. The proper post-exposure processing of the photoresist can be selected from a group consisting of (1) normal developing and (2) image reversal processing.

BRIEF DESCRIPTION OF THE DRAWINGS

FIG. 1A illustrates one method for back illuminating a proximity mask.

DETAILED DESCRIPTION OF THE INVENTION

For the purpose of clarity, the resist covered, insulating cylinders which are described and illustrated may be of the solid glass cylinder type or a glass cylinder with a cylindrical void inside it. In either case, it will simply be referred to as a cylinder.

Figure 1B:
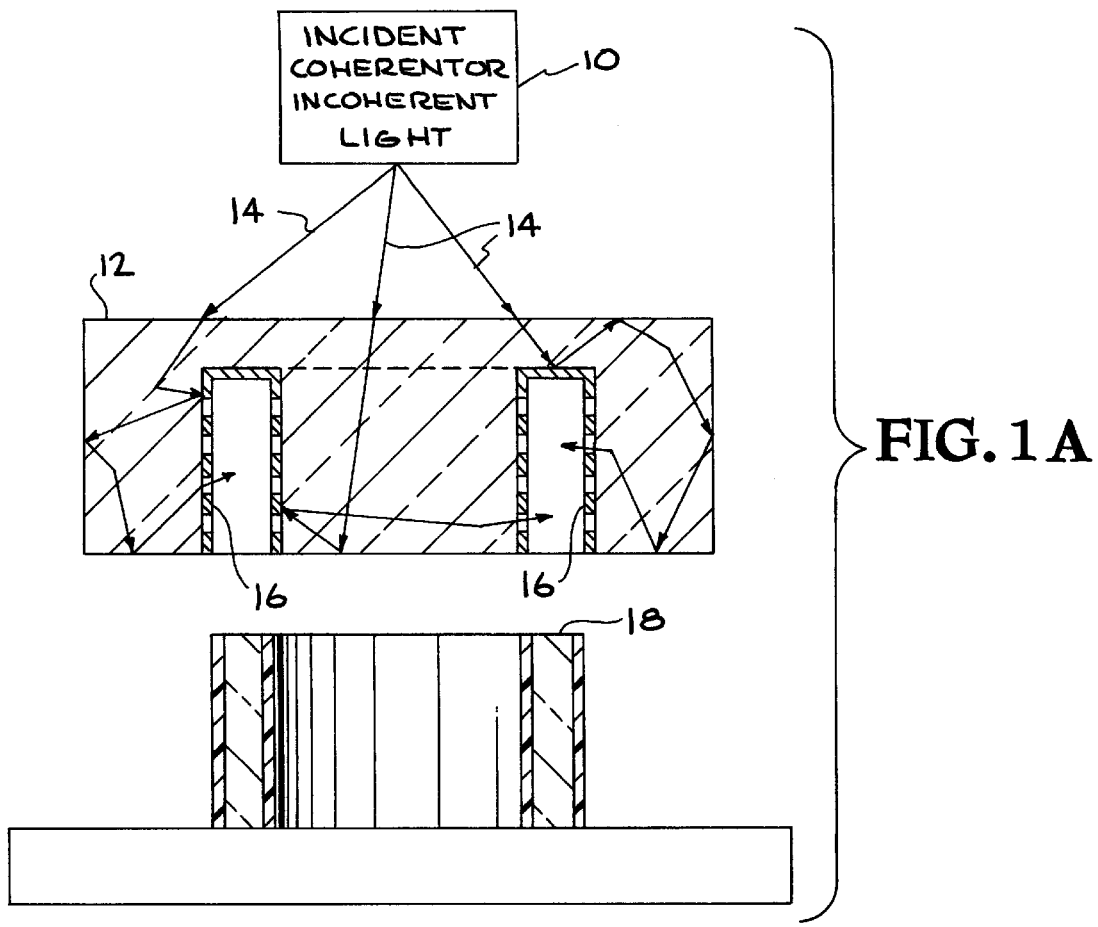
FIG. 1B shows the hollow cylinder having photoresist covered inner and outer walls.
Figure 1B:
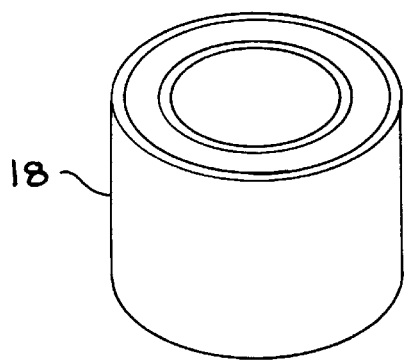
Figure 1C:
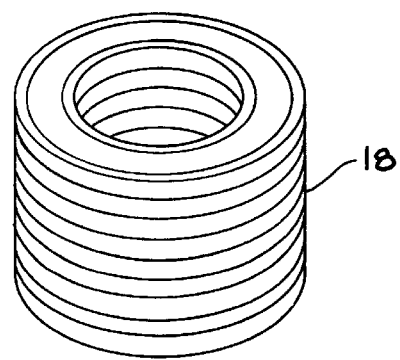
FIG. 1C shows the patterned photoresist on the cylinder walls after the process is complete.

FIGS. 1A–C illustrate one method for back illuminating a proximity mask. This method allows a single source to be used that is either coherent (i.e., a LASER) or incoherent (i.e., an arc lamp). The source 10 illuminates a translucent material 12 on one side and light 14 rattles around until it escapes through the other side through gaps in the metal mask 16. The glass cylinder is prepared by first placing an anti-reflective coating, followed by the resist coating. The illumination system is lowered over the resist covered cylinder 18 before an exposure takes place. Photons reach the photoresist by entering and scattering in the volume of the translucent material 12 and reflecting off its metalized walls before exiting through the gaps (no metal) of the proximity mask 16. FIG. 1B shows the hollow cylinder having photoresist covered inner and outer walls. FIG. 1C shows the patterned photoresist on the cylinder walls after the process is complete.

A coherent monochromatic source such as a LASER will have a beam of light that can be split in amplitude (with beam splitters) or split spatially (with scraper mirrors) into two or more beams. Interfering two beams results in a sinusoidal variation in intensity where, depending on the phase of the waves, they will peak when they constructively interfere and null out (minimum or no intensity) when they destructively interfere. Interfering more than two beams results in a non-sinusoidal shape that may be desirable for sharpening the intensity transition between light and dark regions and changing the duty cycle (the ration of irradiance (where I>Ipeak/2) to the period).

Figure 2A:
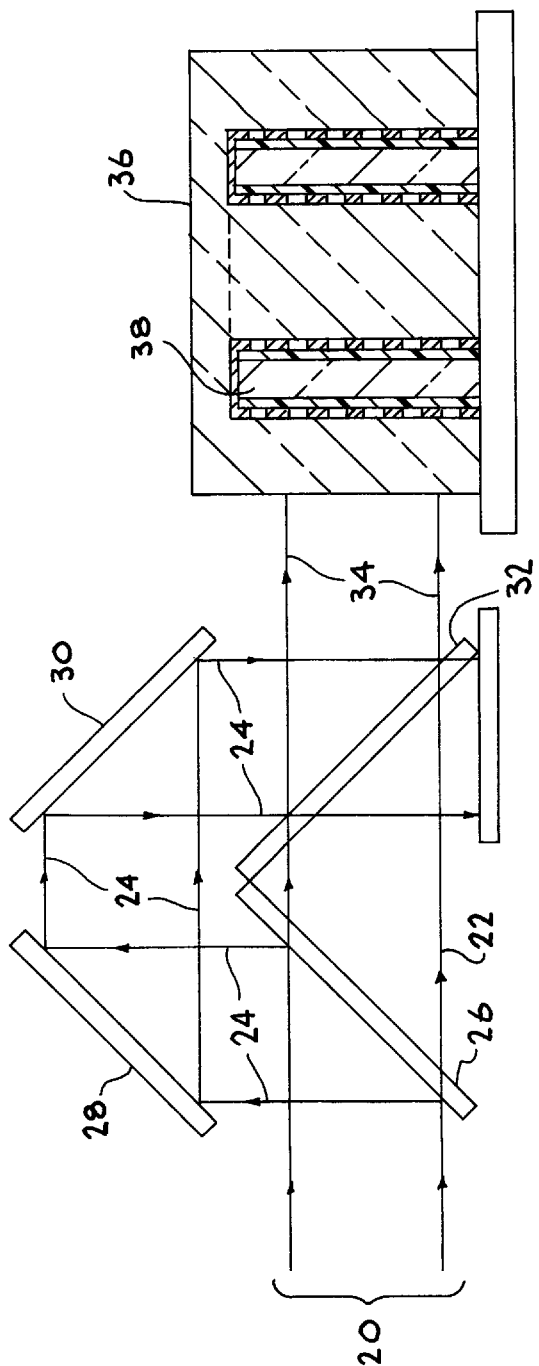
FIG. 2A illustrates the use of interference to generate fringe planes that are used to expose the resist covered cylinder.
Figure 2C:
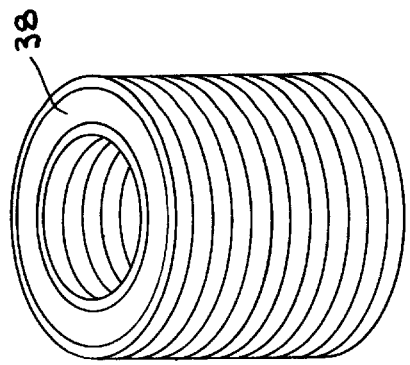
FIG. 2C shows the patterned photoresist on the (cylinder walls after processing.
Figure 2B:
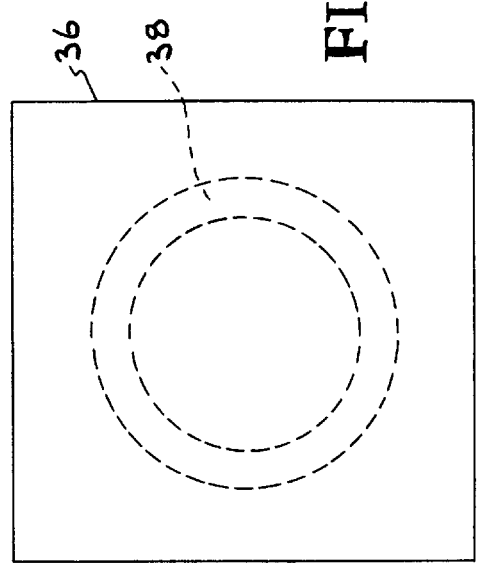
FIG. 2B shows a top view of the index matched cell and the cylinder.

Interference only occurs in the volume of intersection of the beams. Two collimated beams forming a plane of intersection will have the interference planes of constant intensity aligned perpendicularly to the plane of intersection. FIGS. 2A–C illustrate the use of interference to generate fringe planes that are used to expose the resist covered cylinder. The fringe planes are parallel to the cylinder's circular base. The fringe spacing is governed by the grating equation which includes the variables of wavelength and the slight angle between the recombined beams. An index matched cell contains the cylinder to prevent focusing of the collimated beams. Coherent light 20 is separated into two beams 22 and 24 by beamsplitter 26. Light beam 24 reflects from mirrors 28 and 30 and beamsplitter 32. Light beam 22 passes through beamsplitters 26 and 32 where it interferes with beam 24 to produce an interference pattern in beam 34 which impinges on the index matched cell 36 which contains the cylinder 38. FIG. 2B shows a top view of the index matched cell and the cylinder. FIG. 2C shows the patterned photoresist on the cylinder walls after processing. The first beamsplitter and the two mirrors are at 45° angle of incidence. The last beamsplitter is slightly different than 45° so as to create a plane of incidence parallel to the surface of the paper. Focusing due to the curved surface of the cylinder and a difference in index of refraction between the cylinder and surrounding air is significant and is minimized by using a cell to immerse the cylinder into a liquid whose index of refraction closely matches that of the cylinder material.

Figure 3B:
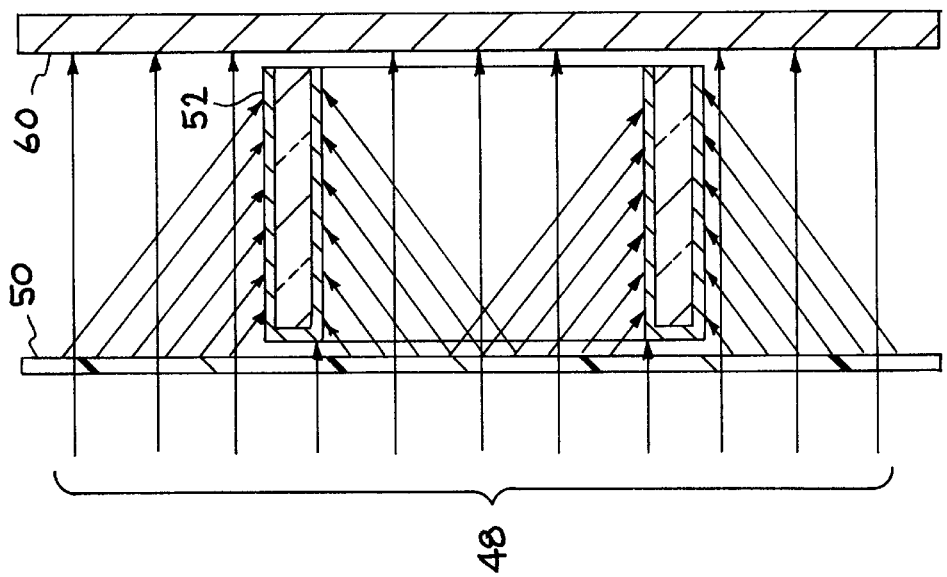
FIG. 3B illustrates how playback of the hologram with the reference beam recreates the desired intensity pattern on the surface of a resist coated cylinder for exposure.
Figure 3A:
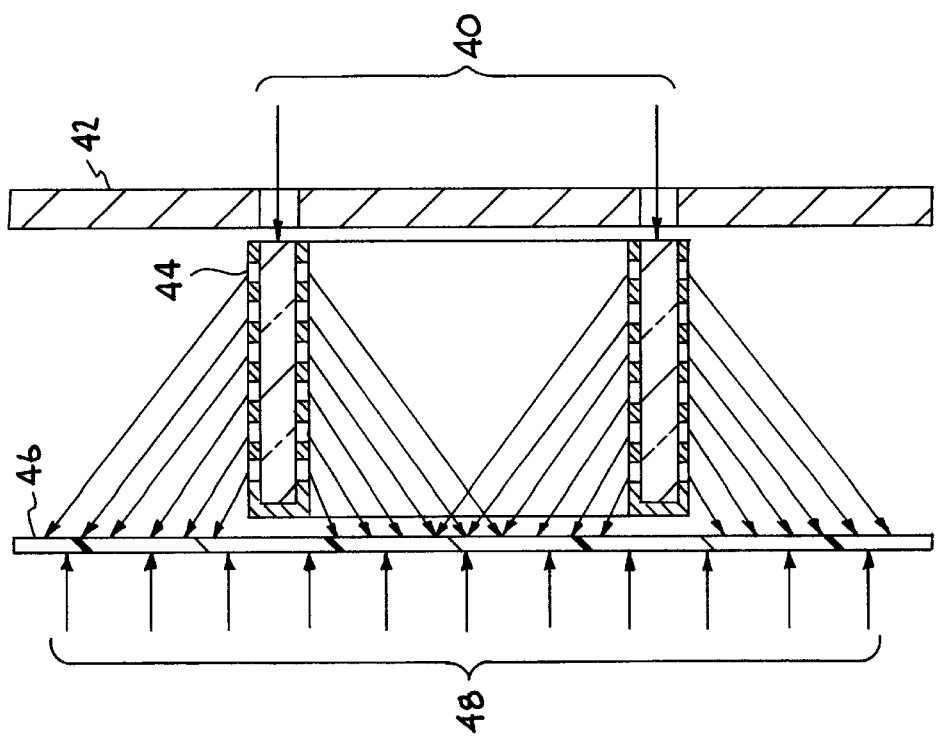
FIG. 3A illustrates how a hologram is generated with a reference beam and an object beam.
Figure 3C:
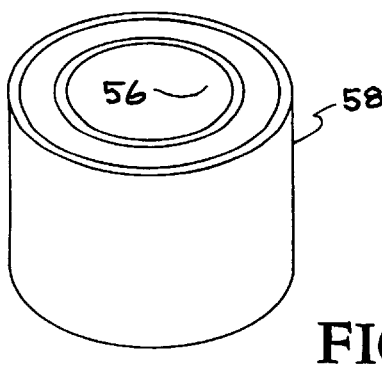
FIG. 3C shows an insulating cylinder with photoresist covering its inner and outer walls.
Figure 3D:
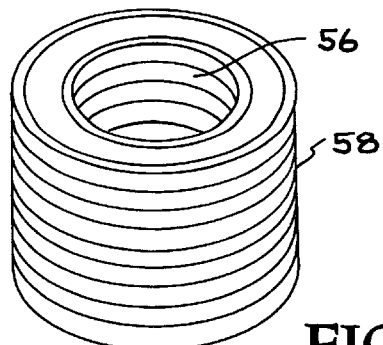
FIG. 3D shows the patterned photoresist on the cylinder walls after processing.

FIG. 3A illustrates how a hologram is generated with a reference beam and an object beam. An incident coherent "object" beam 40 is directed through openings in absorber 42 and into patterned cylinder walls 44. Some of this light propagates from the openings in the patterned cylinder walls onto a piece of holographic film 46, which is simultaneously being illuminated from the rear by another incident coherent "reference" beam 48 to produce a hologram of the patterned cylinder wall. FIG. 3B illustrates how playback of the hologram with the reference beam 48 through developed holographic film 50 recreates the desired intensity pattern on the surface of a resist coated cylinder 52 for exposure. The undiffracted light which goes straight through the hologram gets attenuated by the absorber 60. FIG. 3C shows an insulating cylinder with photoresist covering its inner wall 56 and its outer wall 58. FIG. 3D shows the patterned photoresist on the cylinder walls 56 and 58 after processing.

Figure 4A:
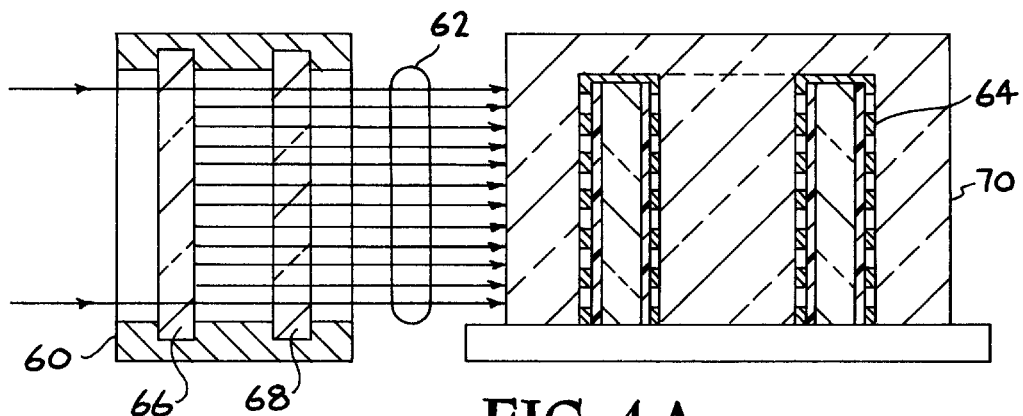
FIG. 4A illustrates how a Fabry-Perot is used to pass thin planes of light to expose a resist coated cylinder.
Figure 4B:
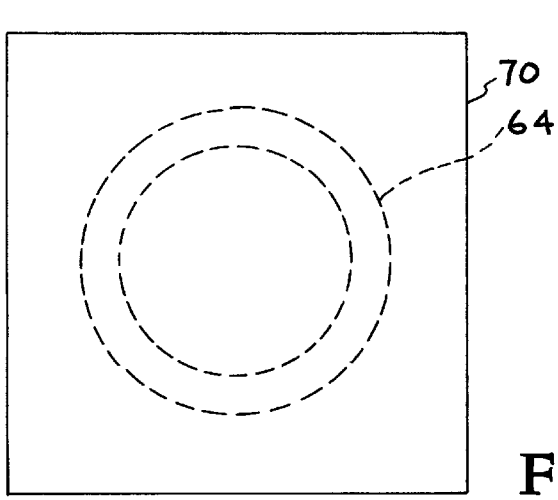
FIG. 4B shows a top view of the cylinder within the index matched cell.
Figure 4C:
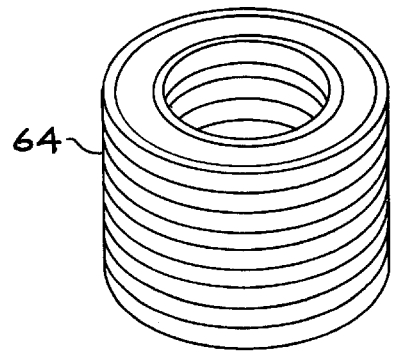
FIG. 4C shows the patterned photoresist on the cylinder walls after processing.

FIG. 4A illustrates how a Fabry-Perot 60 is used to pass thin planes of light 62 (constructive interference) to expose a resist coated cylinder 64. The finesse is controlled by the reflectivity of the two partially reflecting mirrors 66 and 68 which make up the Fabry-Perot 60. The higher the reflectivity of mirrors 66 and 68, the higher the finesse and the thinner the light planes become. A complementary image is available in the beam reflected from the Fabry-Perot. This beam has the opposite ratio of dark to light, namely, the planes of light are broad relative to the fringe spacing. The fringe planes are parallel to the cylinder's circular base. The fringe spacing is governed by the grating equation which includes the variables of wavelength and the slight angle between the mirrored surfaces 66 and 68. An index matched cell 70 contains the cylinder 64 to prevent focusing of the collimated beams. FIG. 4B shows a top view of the cylinder 64 within the index matched cell 70. FIG. 4C shows the patterned photoresist on the cylinder walls after processing.

Another embodiment simplifies the present invention in two important ways. The illumination methods remain but photoresist is not needed. The glass itself, when exposed to a UV light pattern and subsequently heat treated, will change in to an opal-like material. The opal part (where UV illuminated it) shrinks and densifies. The opal part will etch with hydrofluoric acid at a much higher rate than the glass (possibly 50 times faster). This eliminates the need for chrome deposition photoresist dip coating and the subsequent development (to make the mask) and eventual photoresist removal (which can be problematic when there is a metal overcoat on the photoresist during metalization of etched trenches). In another method of treatment, the opal pattern will accept a conducting silver film by immersing it in a molten salt bath containing silver ions. This eliminates the need to trench and coat (or fill) the trenches with a metal.

Changes and modifications in the specifically described embodiments can be carried out without departing from the scope of the invention, which is intended to be limited by the scope of the appended claims. For example, a conical shape (as opposed to a cylinder) may have superior performance in certain applications. Most of the concepts presented can be applied to generate rings in objects of arbitrary shape. In addition, holographic projection and proximity mask methods can generate arbitrary light patterns on arbitrary shaped objects (such as figurines).

The invention claimed is:

1. A method for producing a pattern on a three dimensional, non-planar object, comprising:

produce a pattern of light by generating an interferometric fringe pattern using two beams;

exposing said three dimensional, non-planar object to said pattern of light to produce an exposed pattern; and processing said exposed pattern to produce a developed pattern, wherein said three dimensional, non-planar object comprises insulator material, the method further comprising:

etching said developed pattern into said insulator material to produce an etched pattern; and depositing metal into said etched pattern to embed conductors only in the surface of said insulator material.

2. The method of claim 1, wherein said three dimensional, non-planar object comprises UV sensitive glass, wherein said pattern of light comprises UV light, wherein the step of processing said exposed pattern comprises heat treating said UV sensitive glass, causing said UV sensitive glass that has been exposed to said UV light to become opalized, shrink and densify, the method further comprising etching said opalized glass with hydrofluoric acid.

3. The method of claim 1, wherein said three dimensional, non-planar object comprises an insulator.

4. The method of claim 1, wherein said pattern is selected from a group consisting of a conical insulator and concentric rings to make capacitors.

5. A method for producing a pattern on a three dimensional, non-planar object, comprising:

producing a pattern of light by generating an interferometric fringe pattern using two beams;

exposing said three dimensional, non-planar object to said pattern of light to produce an exposed pattern; and processing said exposed pattern to produce a developed pattern, wherein said three dimensional, non-planar object comprises UV sensitive glass, wherein said pattern of light comprises UV light, wherein the step of processing said exposed pattern comprises heat treating said UV sensitive glass, wherein said heat treating causes said UV sensitive glass that has been exposed to said UV light to become opalized, shrink and densify; the method further comprising immersing said UV sensitive glass into a molten salt bath containing silver ions, wherein said opalized glass selectively allows the formation of a conducting silver film in the opalized glass areas.

* * * * *